United States Patent [19]

Duch

[11] Patent Number: 5,610,950
[45] Date of Patent: Mar. 11, 1997

[54] COMMUNICATION DEVICE WITH REDUCED SENSITIVITY TO IN-CHANNEL INTERFERENCE

[75] Inventor: Krzysztof M. Duch, Hoffman Estates, Ill.

[73] Assignee: Motorola, Inc., Schaumburg, Ill.

[21] Appl. No.: 331,428

[22] Filed: Oct. 31, 1994

[51] Int. Cl.⁶ .................................................. H04B 1/10
[52] U.S. Cl. ........................ 375/350; 375/229; 375/232; 455/296; 327/551; 327/552
[58] Field of Search .................................. 375/350, 346, 375/285, 284, 229, 230, 232, 266; 455/296, 213; 327/551, 552

[56] References Cited

U.S. PATENT DOCUMENTS

| | | | |
|---|---|---|---|
| 3,605,018 | 9/1971 | Coviello | 325/65 |
| 3,911,366 | 10/1975 | Baghdady | 325/347 |
| 4,052,559 | 10/1977 | Paul et al. | 179/1 P |
| 4,088,955 | 5/1978 | Baghdady | 325/56 |
| 4,326,297 | 4/1982 | Sato et al. | 455/213 |
| 4,328,591 | 5/1982 | Baghdady | 455/303 |
| 4,513,249 | 4/1985 | Baghdady | 328/150 |
| 4,739,518 | 4/1988 | Bickley et al. | 455/296 |
| 4,743,871 | 5/1988 | Searle | 375/350 |
| 4,859,958 | 8/1989 | Myers | 329/112 |
| 4,878,251 | 10/1989 | Richardson | 455/206 |
| 4,954,732 | 9/1990 | Surauer et al. | 307/520 |
| 4,992,747 | 2/1991 | Myers | 329/316 |
| 4,998,289 | 3/1991 | Rabe et al. | 455/33 |
| 5,132,797 | 7/1992 | Citta | 455/296 |
| 5,309,481 | 5/1994 | Viviano et al. | 375/266 |

Primary Examiner—Stephen Chin
Assistant Examiner—Thuy L. Nguyen
Attorney, Agent, or Firm—Val Jean Hillman

[57] ABSTRACT

A communications device 100 employs an averaging filter 112 at the output of a demodulator circuit 110 to remove unwanted components introduced by in-channel interfering signals.

19 Claims, 2 Drawing Sheets

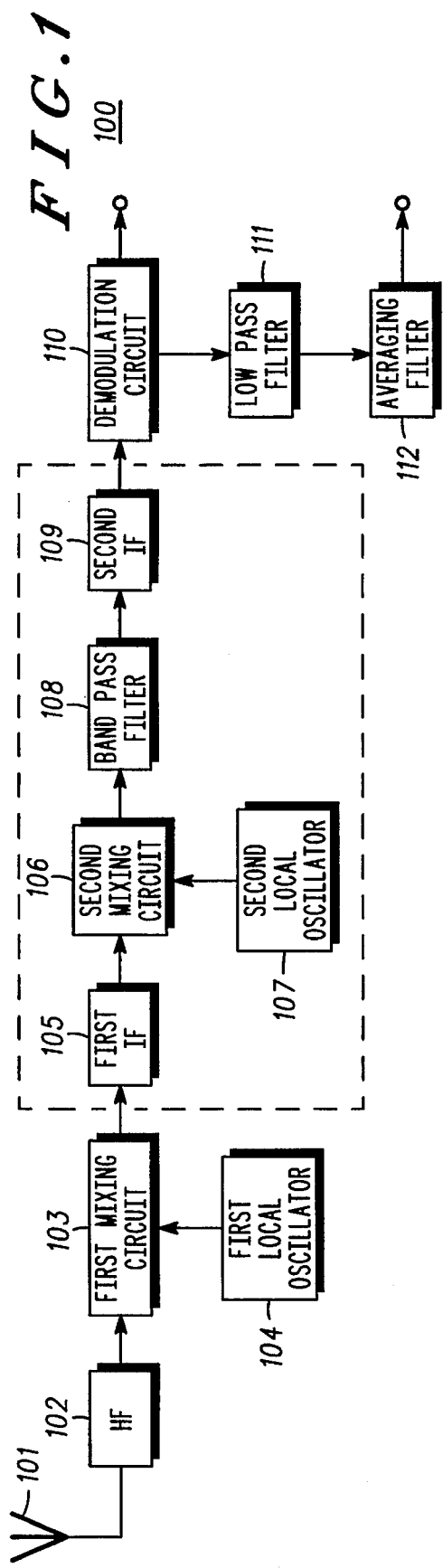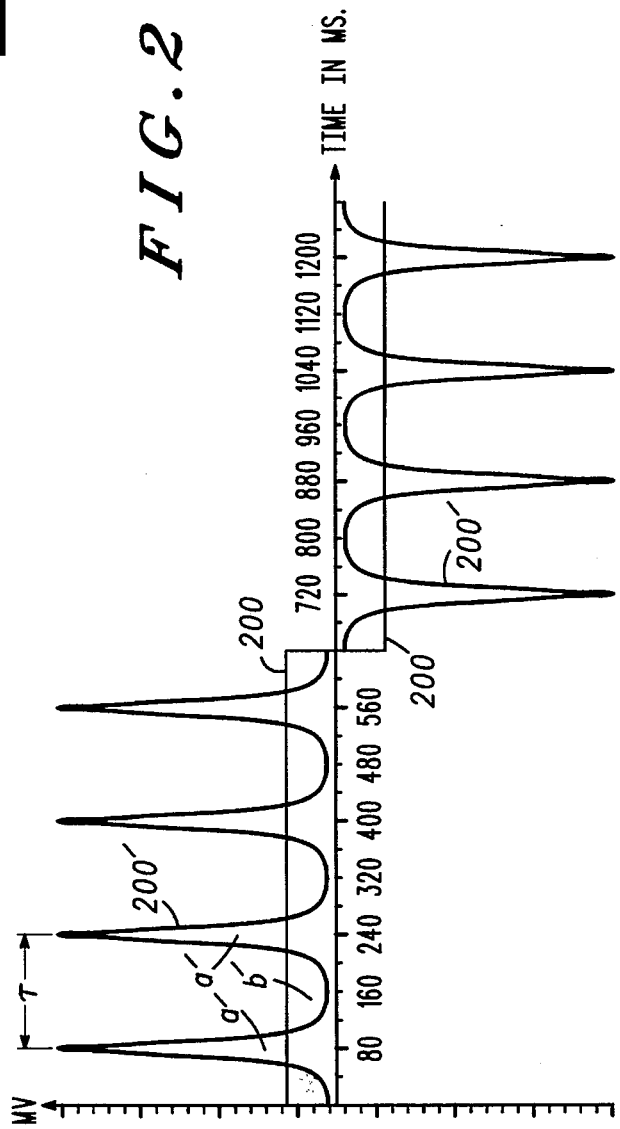

COMMUNICATION DEVICE WITH REDUCED SENSITIVITY TO IN-CHANNEL INTERFERENCE

FIELD OF THE INVENTION

The present invention relates generally to communication devices. More specifically, the invention relates to a communication device with reduced sensitivity to interference typically caused by the reception of undesired signals in the same or substantially the same channel.

BACKGROUND OF THE INVENTION

In most radio communication systems, communication service will tend to be obstructed by the reception of signals transmitted from other communication devices operating on or substantially at the same channel as the desired communicating channel. This phenomenon, often referred to as co-channel or in-channel interference occurs frequently in frequency modulated (FM) radio systems such as cellular radiotelephone communication systems, cord-less telephone systems, microwave communication systems, satellite communication systems and television transmission systems, just to name a few. Due to the pervasiveness of the phenomenon, the prior art reflects several methods and devices designed to overcome the problems associated therewith. Two commonly suggested approaches are resource management (i.e., avoidance) and detection/correction.

Resource management schemes attempt to distribute communication resources in a fashion that reduces the likelihood of an occurrence. For, example, cellular communication systems typically employ elaborate frequency reuse schemes, whereby interfering-channels are separated by large geographic distances in order to improve the ratio of desired signal to undesired signal reception. It is a well established practice in the art that this ratio, also known as the carrier-to-interference (C/I) ratio should provide a 15–18 dB range of separation between carrier and interfering signals in order to promote adequate system performance.

Other resource management solutions range from simply adding additional communication resources, i.e., increasing system bandwidth, to the narrowing of the desired communication channel. While, both approaches may have merit, they often prove too impractical for general applications. For example, system bandwidth is a finite commodity, the cost of which places practical limitations on availability. Narrower channel selection, while providing marginal improvements, nevertheless operates to decrease overall data throughput.

Detection/correction methods tend to address in-channel interference after the fact. A prior art detection device is disclosed in U.S. Pat. No. 4,998,289 assigned to the assignee of the present invention. Upon detection in the above-cited reference, a decision is made by an associated communications device whether to switch to an alternate communications channel.

While the above mentioned methods all attempt to minimize the impact of in-channel interference, they nonetheless fail to resolve the core issue; device sensitivity. It would be extremely advantageous therefore to provide a communication device architecture capable of operating at C/I ratios of less than 15 dB.

BRIEF DESCRIPTION OF THE DRAWINGS

FIG. 1 is a block diagram representation of an embodiment of a communication device in accordance with the present invention;

FIG. 2 is a graphical representation of a desired signal and the resultant signal under the influence of interference;

DETAILED DESCRIPTION OF A PREFERRED EMBODIMENT

Figure 3:
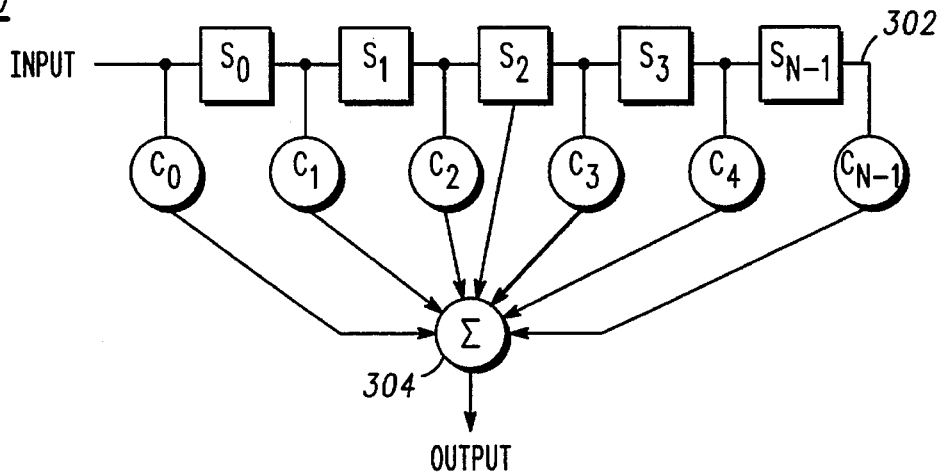
FIG. 3 is a block diagram representation of an embodiment of an averaging filter in accordance with the present invention.

Before describing an embodiment of the present invention, it is believed that an overview will aid in the reader's understanding. The purpose of the present invention is to provide a radio receiver architecture that can effectively operate in an environment exhibiting C/I ratios well below the known 15 dB–18 dB range.

FIG. 1 is a block diagram representation of an embodiment of a communication device 100 in accordance with the present invention. As will be appreciated by those skilled in the art device 100 is a radio receiver. It includes antenna 101 connected to a high frequency (HF) amplifier 102 and designed to receive frequency modulated RF signals. HF amplifier 102 is connected to a first mixing circuit 103 which mixes the received modulated signal as amplified by HF amplifier 102 with a first local oscillation signal as generated by a first local oscillator circuit 104. First mixing circuit 103 outputs an intermediate frequency (IF) signal in response thereto. As may be known, the above-described section of the device architecture comprising antenna 101, HF amplifier 102, first mixing circuit 103 and first local oscillator circuit 104 is commonly referred to as the front end.

The IF signal generated by the device front end is fed to a first IF amplifier 105 which amplifies the IF signal. The amplified IF signal is then fed to a second mixing circuit 106 which mixes the output of the first IF amplifier 105 with a local oscillation signal from a second local oscillation circuit 107. The IF signal output from the second mixing circuit is fed to a second IF amplifier 109 via band pass filter 108. As may be known, the above-described section of the device architecture comprising first IF amplifier 105, second mixing circuit 106, second local oscillation circuit 107, band pass filter 108 and second IF amplifier 109 is commonly referred to as the IF section. As is known, the IF section may comprise a single IF stage as opposed to the two stage IF sections described herein. Moreover, it will be appreciated by those skilled in the art that the IF section as described herein above is optional, as depicted by the dashed box placed around the IF section.

Continuing, the output of the IF section is fed to a demodulator circuit 110 which demodulates the IF signal. The demodulated signal is then fed to a low pass or band pass filter 111. Filter 111 is designed to filter the demodulated signal of unwanted components generated during the demodulation process. While filter 111 is included in the description of the preferred embodiment, it will be appreciated by those skilled in the art that such filtering is optional.

Finally, the demodulated signal is fed to an averaging filter 112 in order to obtain an average value of the demodulated signal over a time T. As will be discussed below, the averaging filter 112 is employed in order to take advantage of a discovery, made pursuant to the present invention; namely, the average signal amplitude of a signal under the influence of interference, when taken over a period, T, where T is the period associated with the spike repetition frequency of the signal under the influence of interference, is equal to the undistorted signal amplitude.

With reference to FIG. 2 there is depicted a graphical representation of a desired signal 200. By way of example and not by way of limitation, desired signal 200 comprises a square wave. As will be appreciated by those skilled in the art, desired signal 200 may take any shape or pattern deemed necessary or desirable for a particular application. Notwithstanding, a square wave was selected in the present example for the sake of simplicity.

Also shown in FIG. 2 is a representation depicting resultant signal 200' under the influence of interference. The signal 200' is characterized by repeated amplitude fluctuations about the desired signal 200 amplitude. These amplitude fluctuations make it very difficult for the typical detection circuit to accurately determine signal 200' bit values, thereby resulting in erroneous bit value detection.

In response, averaging filter 112 is employed to take advantage of an important property exhibited by signal 200'; namely, the average signal amplitude of signal 200', when taken over a period, T, where T is the period associated with the spike repetition frequency of signal 200', is equal to the desired signal 200 amplitude.

With reference to FIG. 2, assuming each interval of time along the X axis is 40 ms, then the spike repetition frequency is 6.24 Hertz (Hz) and the period, T, is approximately 160 ms. Over this 160 ms interval, the sum of the area under the curve that is above the desired signal 200 amplitude value is equal to the area under the cure that is below the desired signal 200 amplitude value. Put another way and with reference to FIG. 2, the sum of areas designated as a' equal the area designated as b'. Thus 2a'=b'.

Armed with this knowledge, one can restore the desired signal 200 from the resultant signal 200' by performing an averaging operation over a single period T or over several such periods, where T is equal to the resultant signal 200' spike period. The rate (i.e., frequency) at which the spikes occur is equal to the difference between the frequency representing bit 0 ($f_0$) and the frequency representing bit 1 ($f_1$). In accordance T can be expressed as:

$$T = 1/(f_1 - f_0) = T_s/m \quad \quad 1)$$

where:

T is the averaging time window;

$T_s$ is the symbol time; and m is the modulation index.

As a practical matter, better performance is achieved when the number of periods T that the averaging operation is performed over is a time period less than the symbol time $T_s$. Thus, $$K \cdot T \leq T_s \quad \quad 2)$$

where:

K is an integer value representing a number of spikes per symbol time; and $$K \leq m \quad \quad 3)$$

One simple way of implementing the averaging filter 112 of FIG. 1 is by utilizing a moving average filter. FIG. 3 is a block diagram representation of an embodiment of an averaging filter that is anticipated for use by the present invention. It will be appreciated by those skilled in the art that the device of FIG. 3 is a digital Finite Impulse Response (FIR) filter 300 comprising an N stage shift register 302 or tapped delay line for acquiring N samples of the signal 200' over the time T. The N samples are equally weighted by gain coefficients, $C_0$ to $C_{N-1}$. The N samples are then added by summer 304 to obtain the average signal amplitude over the time T.

Figure 4:
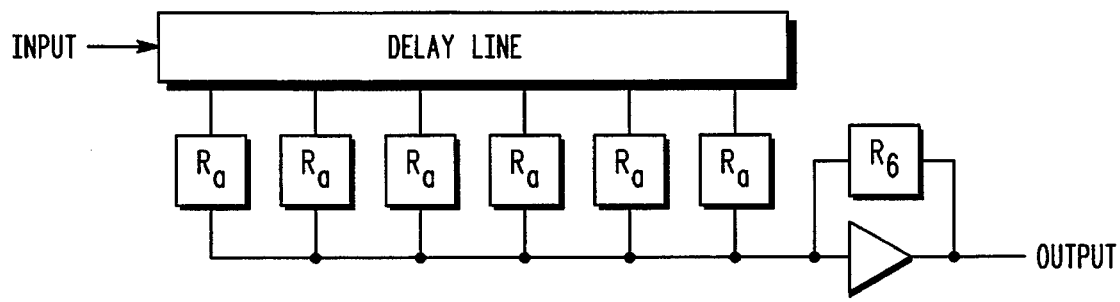
FIG. 4 is a block diagram representation of another embodiment of an averaging filter in accordance with the present invention.

FIG. 4 is a block diagram representation of another embodiment of an averaging filter 400 anticipated for use by the present invention. As will be appreciated by those skilled in the art FIG. 4 is a lag or delay line filter that is the analog counterpart of the averaging filter disclosed in FIG. 3.

Figure 5:
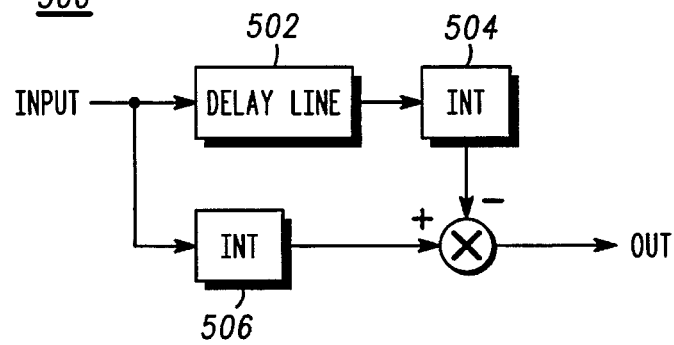
FIG. 5 is a block diagram representation of yet another embodiment of an averaging filter in accordance with the present invention.

FIG. 5 is a block diagram representation of yet another embodiment of an averaging filter 500 for use by the present invention. In this embodiment the resultant signal 200' is delayed by delay line 502 and then integrated by integrator 504. The resultant signal 200' is also integrated by integrator 506. Thereafter, the delayed version of the integrated input signal is subtracted from the non-delayed version of the integrated input signal in order to obtain the average signal amplitude over the time T.

In summation, the present invention involves the use of averaging filters such as, but not limited to comb filters, moving average filters, lag filters, and transversal filters in a communication device. Such filters are employed to take advantage of an important property exhibited by signals under the influence of in-channel interference; namely, the average signal amplitude of a signal distorted by in-channel interference, when taken over a period, T, where T is the period associated with the spike repetition frequency of the resultant signal, is equal to the undistorted signal amplitude.

In operation, an averaging filter is connected to the output of a demodulator circuit, like the one shown in FIG. 1, to average out in-channel interference, over a time T, where T is a function of the modulation index, m and the symbol time Ts in accordance with equations 1–3 above. By obtaining the average signal value in accordance with the present invention, the desired signal level can be derived from a resultant signal under the influence of interference in a fashion that resolves the core issue of communication device sensitivity to in-channel interference.

What is claimed is:

1. A communications device comprising:

a front end for receiving a modulated signal comprising frequencies $f_0$ and $f_1$ transmitted over a communication channel, said modulated signal comprising unwanted distortion components exhibiting spikes at a repetition frequency, T, where $T = 1/(f_1 - f_0)$;

a demodulator circuit, coupled to the front end, for demodulating the frequencies $f_0$ and $f_1$ to generate a demodulated signal; and an averaging filter comprising a delay line having a plurality of taps having equal weights, coupled to the demodulator circuit, for filtering the demodulated signal and averaging the demodulated signal over the period T to remove the unwanted distortion component therefrom, thereby operating as a digital integrator.

2. The device of claim 1 wherein the front end comprises: an antenna which receives modulated radio frequency (RF) signals, a high frequency amplifier coupled to the antenna for amplifying the received RF signal, a first mixing circuit for mixing an output of the high frequency amplifier with a first local oscillation signal to generate a first intermediate frequency (IF) signal.

3. The device of claim 1 further comprising an IF circuit coupled to the front end for receiving the first IF signal.

4. The device of claim 1 further comprising a low pass filter coupled between the demodulator circuit and the averaging filter.

5. The device of claim 1 wherein the averaging filter is selected from the group consisting of: comb filters, lag filters transversal filters and moving average filters.

6. A radio frequency (RF) receiver comprising:

a front end for receiving modulated RF signals comprising frequencies $f_0$ and $f_1$ transmitted over an RF communication channel, said modulated RF signal comprising unwanted distortion components exhibiting spikes at a repetition frequency, T, where $T=1(f_1-f_0)$;

an IF circuit coupled to the front end for converting the modulated RF signal to an IF signal;

a demodulator circuit, coupled to the IF circuit, for demodulating the frequencies $f_0$ and $f_1$ from the IF signal to generate a demodulated signal; and an averaging filter comprising a delay line having a plurality of taps having equal weights, coupled to the demodulator circuit, for filtering the demodulated signal and averaging the demodulated signal over the period T to remove the unwanted distortion components.

7. The device of claim 6 wherein the averaging filter is selected from the group consisting of: comb filters, lag filters transversal filters and moving average filters.

8. The device of claim 6 wherein the averaging filter filters the demodulated signal to remove unwanted components generated during the demodulation process.

9. A radio frequency (RF) receiver having a front end for receiving modulated RF signals comprising frequencies $f_0$ and $f_1$ transmitted over an RF communication channel, said modulated RF signals exhibiting distortion spikes at a repetition frequency, T, where $T=1/(f_1-f_0)$ due to the presence of in-channel interfering signals, an IF circuit coupled to the front end for converting the modulated RF signal to an IF signal and a demodulator circuit, coupled to the IF circuit, for demodulating the IF signal to generate a demodulated signal, wherein the improvement comprises:

an averaging filter comprising a delay line having a plurality of taps having equal weights, coupled to the demodulator circuit, for filtering the demodulated signal and averaging the demodulated signal over the period T to remove unwanted distortion components thereby operating as a digital integrator.

10. The device of claim 9 wherein the averaging filter is selected from the group consisting of: comb filters, lag filters transversal filters and moving average filters.

11. The device of claim 9 further comprising a low pass filter disposed between the demodulator circuit and the averaging filter to remove unwanted components generated during the demodulation process.

12. The device of claim 9 wherein the averaging filter removes unwanted components generated during the demodulation process.

13. A method for removing in-channel interference from a modulated RF signal comprising frequencies $f_0$ and $f_1$, the method comprising the steps of:

receiving at a communication device, a modulated RF signal comprising desired signal components and undesired signal components exhibiting spikes at a repetition frequency, T, where $T=1/(f_1-f_0)$;

demodulating the frequencies $f_0$ and $f_1$ of the modulated RF signal to generate a demodulated signal, said demodulated signal having the desired signal components and the undesired signal components; and integrating the demodulated signal to obtain an average value of the demodulated signal over the time T in order to remove the undesired signal components.

14. The method of claim 13 further comprising the steps of: converting the modulated RF signal into an IF signal; and demodulating the IF to generate a demodulated signal.

15. The method of claim 13 wherein the step of obtaining an average value further comprises the step of:

sampling the demodulated signal a number of times N for the period of time T; and averaging the N number of samples.

16. The method of claim 13 wherein the step of obtaining an average value further comprises the step of:

measuring the demodulated signal for the period of time T; and averaging the measurements together.

17. The method of claim 13 further comprising the step of defining the period of time T as a function of a symbol time, $T_s$, and a modulation index, m.

18. The method of claim 17 further comprising the step of determining a number of averaging intervals as T·k, where k in an integer value representing a number of distortion peaks within a symbol time $T_s$, and further where $T \cdot k \leq T_s$.

19. The method of claim 17 further comprising the step of defining T as $T_s/m$.

* * * * *